(12) United States Patent
Nakabayashi

(10) Patent No.: US 6,674,111 B2
(45) Date of Patent: Jan. 6, 2004

(54) SEMICONDUCTOR DEVICE HAVING A LOGIC TRANSISTOR THEREIN

(75) Inventor: Takashi Nakabayashi, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/931,015

(22) Filed: Aug. 17, 2001

(65) Prior Publication Data

US 2002/0024076 A1 Feb. 28, 2002

(30) Foreign Application Priority Data

Aug. 24, 2000 (JP) ........................................ 2000-253680

(51) Int. Cl.[7] .......................................... H01L 27/108
(52) U.S. Cl. .................. 257/296; 257/298; 257/306; 257/401; 438/183; 438/740; 438/970
(58) Field of Search ................... 257/296, 298, 257/306, 401; 438/183, 740, 970

(56) References Cited

U.S. PATENT DOCUMENTS

| 5,891,762 | A | | 4/1999 | Sakai et al. | |
|---|---|---|---|---|---|
| 5,895,250 | A | * | 4/1999 | Wu | 438/396 |
| 6,010,931 | A | * | 1/2000 | Sun et al. | 438/240 |
| 6,143,596 | A | * | 11/2000 | Wang | 438/238 |
| 6,228,761 | B1 | * | 5/2001 | Ngo et al. | 257/382 |
| 6,329,251 | B1 | * | 12/2001 | Wu | 438/275 |

FOREIGN PATENT DOCUMENTS

| JP | 4-10651 | | 1/1992 | |
|---|---|---|---|---|
| JP | 6-232374 | | 8/1994 | |
| JP | 9-51038 | | 2/1997 | |
| JP | 9-252098 | | 9/1997 | |
| JP | 10-004190 A | * | 1/1998 | ........ H01L/29/78 |
| JP | 10-189897 | | 7/1998 | |

* cited by examiner

Primary Examiner—Eddie Lee
Assistant Examiner—Matthew E. Warren
(74) Attorney, Agent, or Firm—Nixon Peabody LLP; Donald R. Studebaker

(57) ABSTRACT

An etch stopper member is formed under a cell plate electrode so as to surround an active region along a periphery of the cell plate electrode. The etch stopper member is formed from a material that is resistant to an etchant of a first interlayer insulating film. For example, a dummy gate line and a cylindrical wall formed thereon are provided as the etch stopper member. Either the dummy gate line or the cylindrical wall may be provided as the etch stopper member. The etch stopper member prevents the interlayer insulating film from being laterally etched at the boundary between a DRAM memory section and a logic section. This eliminates the need to provide an etching margin, allowing for reduction in the area of the DRAM memory section.

21 Claims, 12 Drawing Sheets

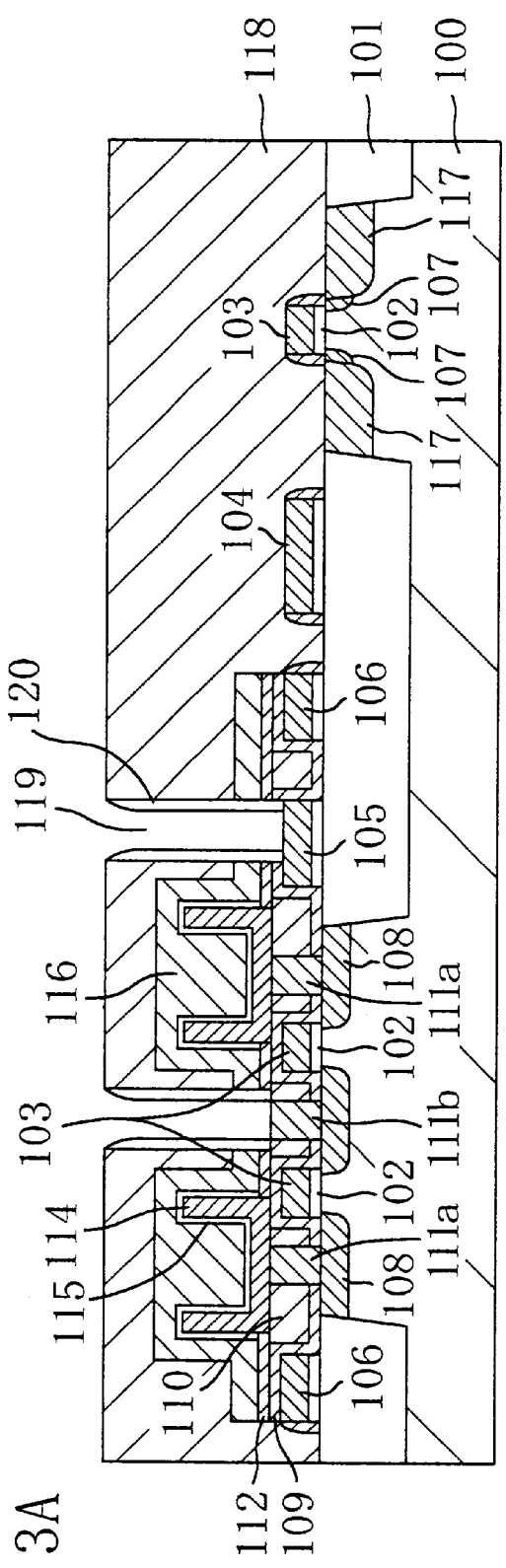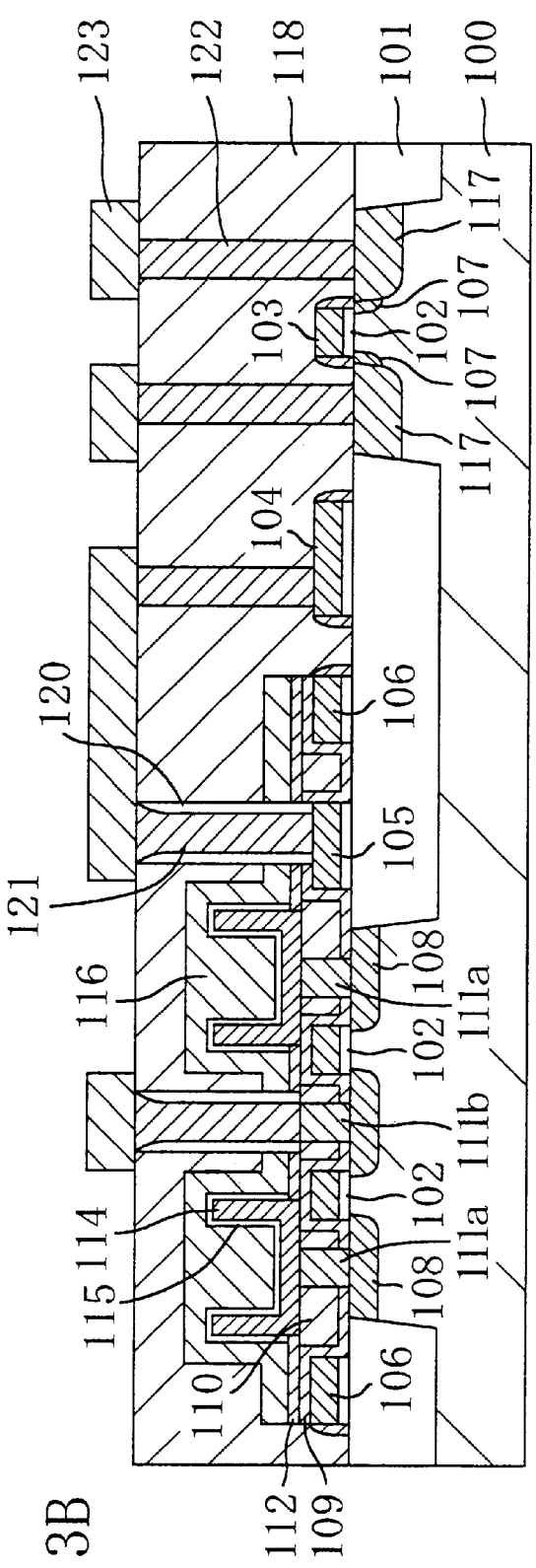
FIG. 3A
FIG. 3B

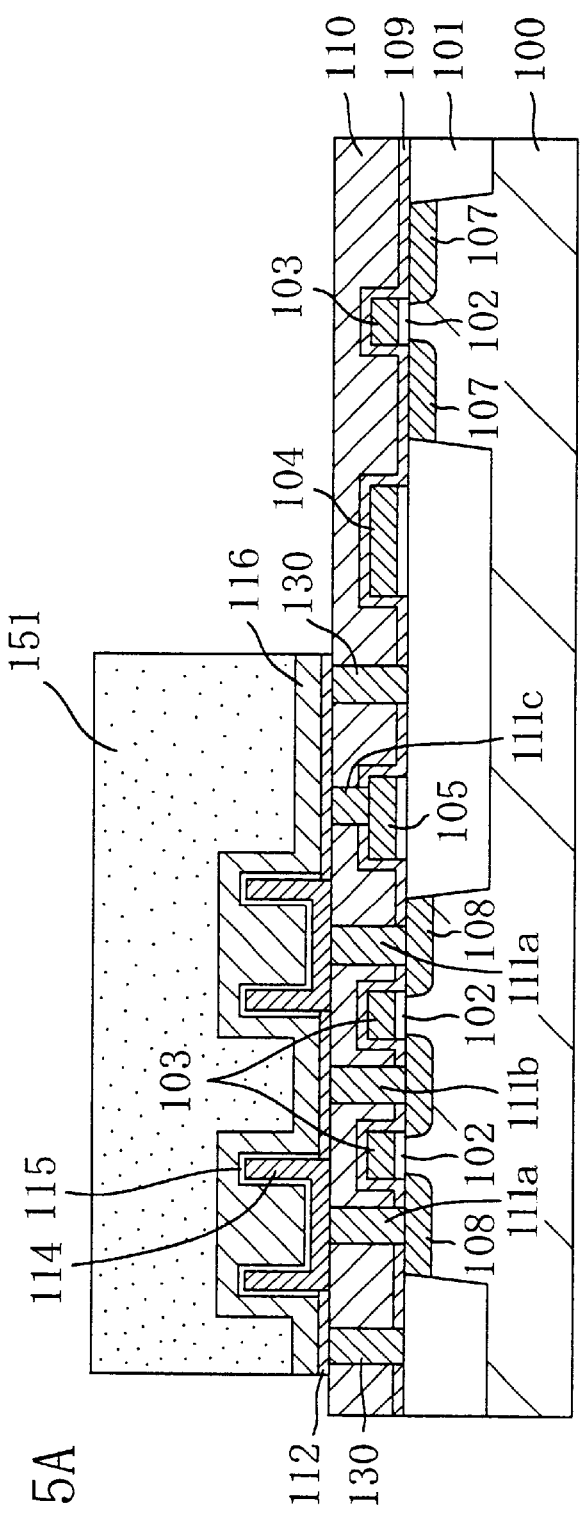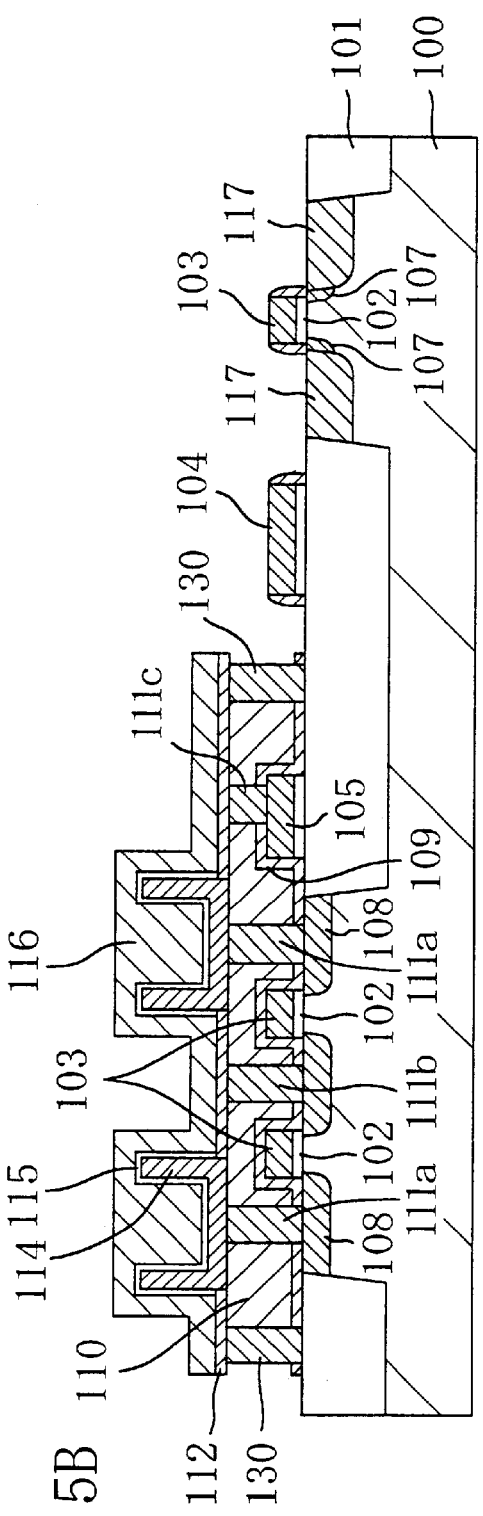
FIG. 5A
FIG. 5B

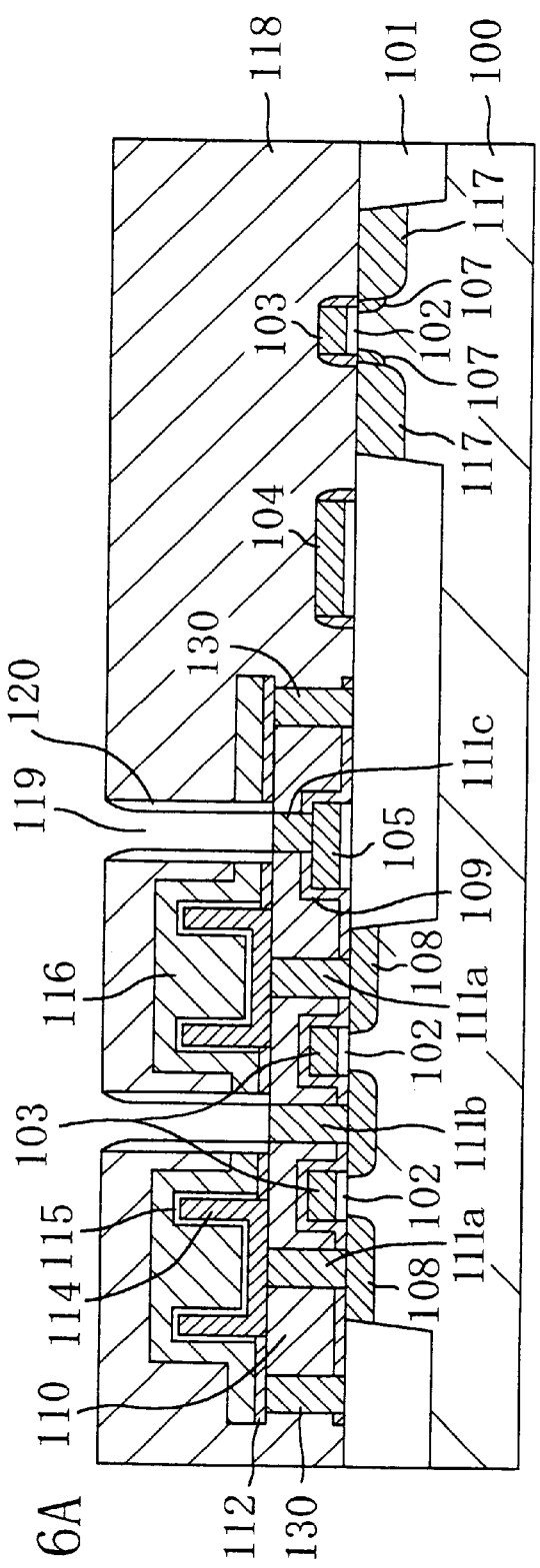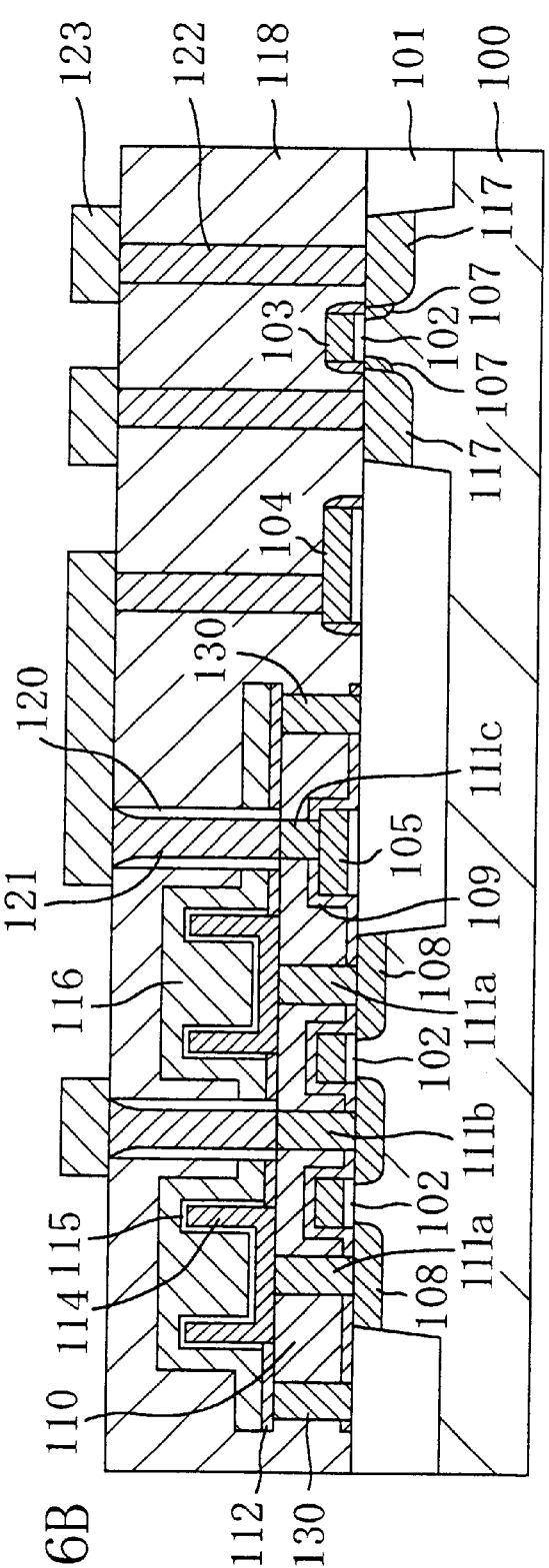

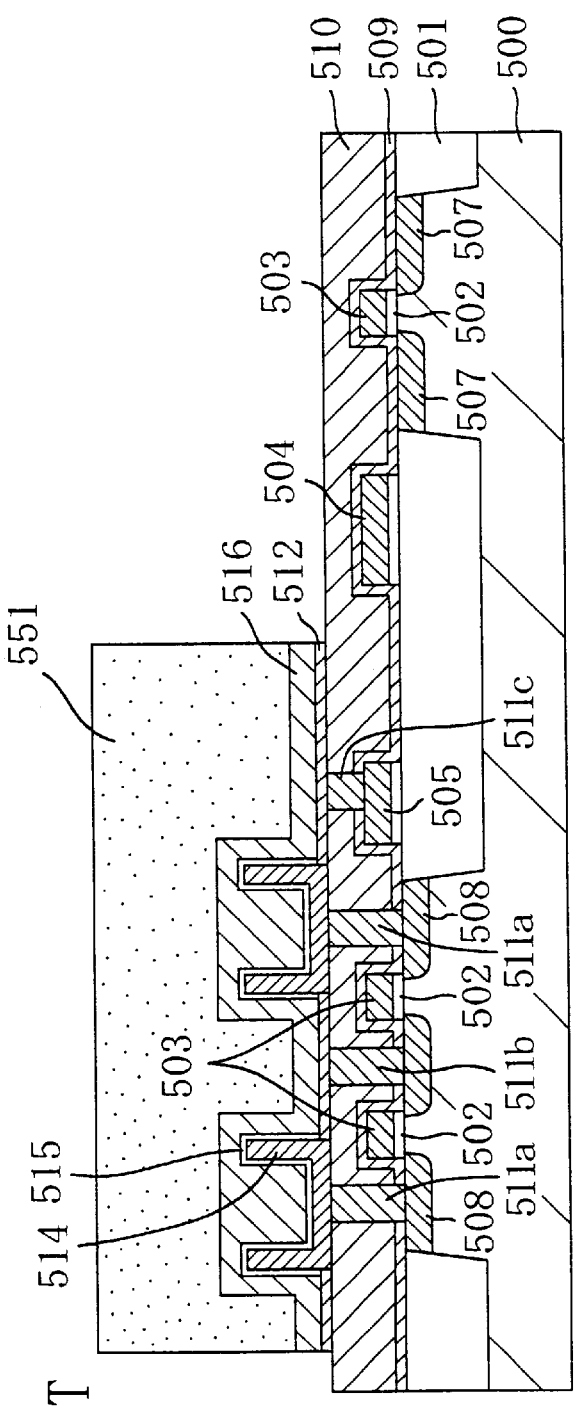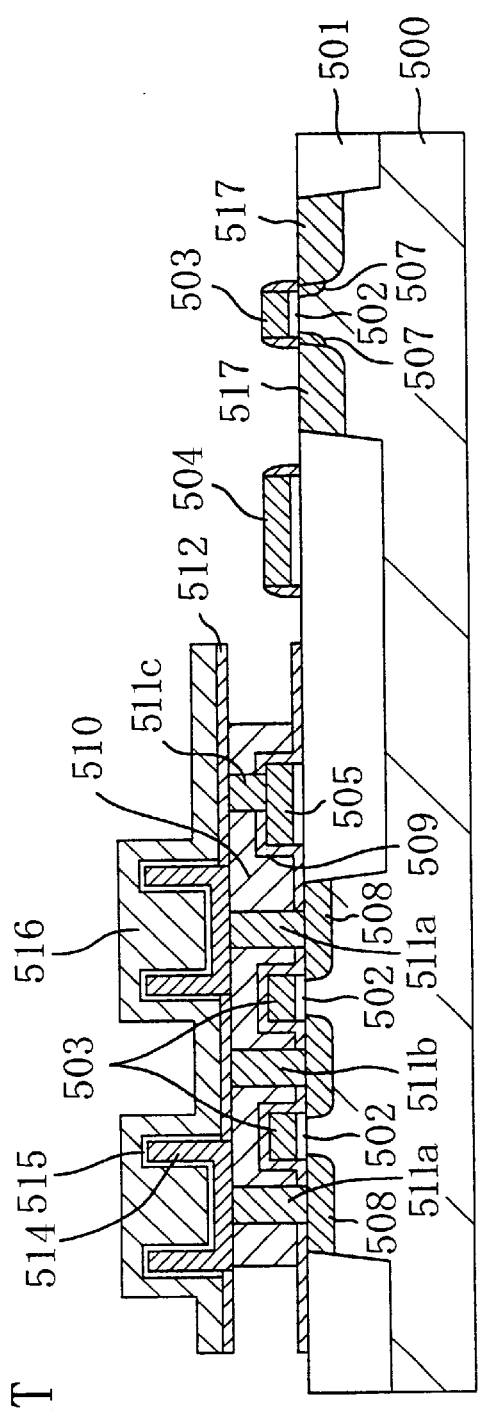
PRIOR ART
FIG. 10A
PRIOR ART
FIG. 10B

DRAM CELL REGION    PERIPHERAL LOGIC REGION

SEMICONDUCTOR DEVICE HAVING A LOGIC TRANSISTOR THEREIN

BACKGROUND OF THE INVENTION

The present invention generally relates to a semiconductor device including a DRAM (Dynamic Random Access Memory) memory cell and a manufacturing method of the same. More particularly, the present invention relates to a semiconductor device incorporating a logic transistor therein, and a manufacturing method of the same.

Recent progress in semiconductor fine processing technology has enabled semiconductor elements integrated at 1-giga level to be formed on a single semiconductor LSI (Large-Scale Integration). Thus, a system that is conventionally formed from several semiconductor LSIs of separate chips is about to be formed on a single chip (system on silicon). The current main technology for implementing this system is an embedded DRAM (e-DRAM), i.e., integration of a high-speed logic LSI with a DRAM, a mass-storage general-purpose memory.

A memory cell in the DRAM is formed from a capacitor having a capacity insulating film, and a MIS (Metal Insulator Semiconductor) transistor for charging and discharging the capacitor. A thermal processing at about 800° C. (formation of a thermal oxide film) is required to form the capacity insulating film. Technology for forming the capacity insulating film at a reduced temperature by using a highly dielectric material such as a tantalum oxide film (a lower-temperature process) is under study, but has not reached a practical level. On the other hand, in the logic LSI requiring a high-speed operation, reduction in the gate length of the MIS transistor is an essential requirement. Therefore, a lower-temperature process is required in order to suppress impurity diffusion and thus the short-channel effect. In order to integrate the DRAM and the logic LSI on the same chip, the process must be conducted successively while recognizing the difference in need for the lower-temperature process between the DRAM and the logic LSI.

In this case, in the DRAM having a trench-type memory cell structure, i.e., a structure in which the cell plate electrode and the capacity insulating film of the capacitor are disposed in a trench, the capacitor can be formed before formation of the MIS transistor. Accordingly, even if the respective MIS transistors of the DRAM and the logic LSI are formed in a common process after formation of the capacitor, problems resulting from the difference in need for a reduced process temperature between the DRAM and the logic LSI can be easily avoided. Thus, the trench-type memory cell structure is said to be suitable for the e-DRAM. However, the step for forming the capacitor is complicated, and also reduction in the memory cell size is significantly restricted. Therefore, a stacked memory cell structure employed in many DRAMs, i.e., a structure in which the capacitor is provided above the MIS transistor, has been regarded as appropriate.

In the stacked memory cell structure, the following process has been proposed and practiced in order to avoid the problems due to the thermal processing: first, an MIS transistor of the DRAM memory section and a capacitor provided thereon with an interlayer insulating film therebetween are formed. In this step, a gate electrode and an LDD (Lightly Doped Drain) region of the MIS transistor of the logic section are formed, but high-concentration source/drain regions are not formed yet. Thereafter, the interlayer insulating film covering also the logic section is removed, and the source/drain regions of the MIS transistor of the logic section and the like are formed.

FIGS. 9A to 11B are cross-sectional views illustrating an example of a conventional method for manufacturing an e-DRAM semiconductor device using such a process. More specifically, FIGS. 9A to 9C illustrate from the beginning of the manufacturing process of the semiconductor device to the step of forming a storage node electrode in a DRAM memory section. FIGS. 10A and 10B illustrate from the step of forming a capacitor of the DRAM memory section to the step of removing a first interlayer insulating film and forming a sidewall. FIGS. 11A and 11B illustrate from the step of forming a second interlayer insulating film to the step of forming a wiring layer.

First, in the step of FIG. 9A, an element-isolation insulating film 501 surrounding active regions of a DRAM memory section and a logic section is formed at a silicon substrate 500. Then, a silicon oxide film and a polysilicon film are sequentially deposited on the substrate. Thereafter, these films are patterned to form a gate insulating film 502 and a gate electrode 503 of each MIS transistor of the DRAM memory section and the logic section. At this time, a gate line 504 connected to the gate electrode 503 of the logic section and a gate line 505 connected to the gate electrode 503 of the DRAM memory section are formed on the element-isolation insulating film 501. Then, impurities are introduced into the active regions of the logic section and the DRAM memory section by ion implantation or the like, thereby forming LDD regions 507 of the MIS transistor of the logic section as well as source/drain regions 508 of the MIS transistor (memory cell transistor) of the DRAM memory section.

In the step of FIG. 9B, a thin silicon nitride film 509 is deposited on the substrate so as to cover the gate electrodes 503 and the gate lines 504, 505. Then, a first interlayer insulating film 510 of a silicon oxide film is deposited on the substrate. After planarizing the first interlayer insulating film 510, contact holes are formed in the DRAM memory section so as to extend through the first interlayer insulating film 510 and the silicon nitride film 509 to the source/drain regions 508 and the gate line 505, respectively. At this time, no contact hole is formed in the logic section. Then, each contact hole is filled with a conductor film (e.g., a polysilicon film or a tungsten film), thereby forming a conductor plug 511a (part of a storage node) connected to the source of the source/drain regions 508 of the MIS transistor of the DRAM memory section, a conductor plug 511b (bit-line contact) connected to the drain of the source/drain regions 508, and a conductor plug 511c (word-line contact) connected to the gate line 505. Note that the conductor plugs 511b, 511c are not necessarily formed in the cross section of FIG. 9B and FIGS. 9C to 11B described below, but are shown as being present in this cross section for better understanding.

Then, in the step of FIG. 9C, a thin silicon nitride film 512 is formed on the substrate so as to cover the first interlayer insulating film 510 and the conductor plugs 511a to 511c. Thereafter, a silicon oxide film 513 is deposited on the substrate. The silicon oxide film 513 and the silicon nitride film 512 are selectively removed to form an opening such that the conductor plug 511a on the source of the source/drain regions 508 of the DRAM memory section is exposed at the bottom of the opening. Then, a polysilicon film and a photoresist film are formed on the substrate, and the top surface of the substrate is planarized by using an etch-back method. Thus, a bottomed cylindrical storage node electrode 514 of the polysilicon film as well as a photoresist portion 550 that fills a recess formed by the storage node electrode 514 are formed in the opening.

In the step of FIG. 10A, the photoresist portion 550 is removed by ashing or the like, and then the silicon oxide film 513 is selectively removed using hydrofluoric acid or the like. Then, a very thin silicon nitride film is deposited on the substrate, and the surface of the silicon nitride film thus deposited is oxidized to form a capacity insulating film 515 on the storage node electrode 514. Note that, although not shown in FIG. 10A, a stacked layer of the silicon nitride film and the silicon oxide film is formed also on the silicon nitride film 512. Then, a polysilicon film is deposited on the substrate, and a photoresist film 551 is formed so as to cover the DRAM memory section as well as expose the logic section. The polysilicon film and the silicon nitride film 512 are removed in the logic section by anisotropic dry etching using the photoresist film 551 as a mask, thereby forming a cell plate electrode 516 on the silicon nitride film 512.

In the step of FIG. 10B, the photoresist film 551 is removed. Then, by using the cell plate electrode 516 as a mask, the first interlayer insulating film 510 is selectively removed by wet etching with hydrofluoric acid. Thereafter, the exposed portion of the silicon nitride film 509 on the substrate is anisotropically etched (dry etched) to form sidewalls on the respective side surfaces of the gate electrode 503 and the gate line 504 of the logic section. Impurities are then introduced into the active regions of the logic section by ion implantation or the like, thereby forming high-concentration source/drain regions 517 outside the LDD regions 507.

In the step of FIG. 11A, a second interlayer insulating film 518 of a silicon oxide film is deposited on the substrate. Then, contact holes 519 are formed in the DRAM memory section so as to extend through the second interlayer insulating film 518, the cell plate electrode 516 and the silicon nitride film 512 to the conductor plug 511b (bit-line contact) on the drain of the source/drain regions 508 and the conductor plug 511c (word-line contact) on the gate line 505, respectively. A silicon oxide film is then deposited on the substrate and anisotropically etched to form an oxide-film sidewall 520 on the side surface of each contact hole 519.

In the step of FIG. 11B, contact holes are formed in the logic section so as to extend through the second interlayer insulating film 518 to the high-concentration source/drain regions 517 and the gate line 504, respectively. Then, a conductor plug 521 filling each contact hole 519 of the DRAM memory section as well as a conductor plug 522 filling each contact hole of the logic section are simultaneously formed. A wiring 523 of an aluminum alloy film or the like is formed on the second interlayer insulating film 518 so as to be connected to each conductor plug 521, 522.

In this manufacturing method, a capacitor of the DRAM memory section can be formed before formation of the high-concentration source/drain regions 517 of the MIS transistor of the logic section. Therefore, diffusion of the impurities in the high-concentration source/drain regions 517 of the MIS transistor of the logic section can be suppressed. As a result, reduction in a threshold voltage due to the short-channel effect of the MIS transistor of the logic section is suppressed, whereby high-speed operation can be retained with sufficient voltage application to the gate electrode.

SUMMARY OF THE INVENTION

It is an object of the invention to provide a semiconductor device that has a reduced area of a DRAM memory section by preventing a void region Rvo from being produced in the DRAM memory section, and thus includes a DRAM integrating memory cells at a higher density, and a manufacturing method of the same.

A semiconductor device of the present invention includes: a semiconductor substrate having an active region; an element-isolation insulating film provided on the semiconductor substrate so as to surround the active region; a gate insulating film and a gate electrode which are provided on the active region of the semiconductor substrate; source/drain regions respectively provided in regions located on both sides of the gate electrode within the semiconductor substrate; an interlayer insulating film provided on the semiconductor substrate; a storage node having an electrode portion extending on the interlayer insulating film and a plug portion extending through the interlayer insulating film so as to be connected to the source/drain region; a capacity insulating film provided on the electrode portion of the storage node; a cell plate electrode facing the electrode portion of the storage node with the capacity insulating film interposed therebetween; and an annular etch stopper member formed from a material resistant to an etchant of the interlayer insulating film, and provided under the cell plate electrode so as to surround the active region along a periphery of the cell plate electrode, wherein the semiconductor device functions as a DRAM (Dynamic Random Access Memory) memory cell.

Since the etch stopper member having a high etching selection ratio to the interlayer insulating film is provided under the cell plate electrode. Therefore, the interlayer insulating film located under the cell plate electrode will not be etched in the manufacturing process. Accordingly, a dimensional margin in preparation for partial removal of the interlayer insulating film under the cell plate electrode need not be provided for the cell plate electrode, allowing for reduction in the area of the DRAM memory section.

The etch stopper member may include a dummy gate line provided on the element-isolation insulating film and formed from the same material as that of the gate electrode. This enables the etch stopper member to be provided without increasing the number of steps, thereby preventing increase in manufacturing costs.

The etch stopper member may be a cylindrical wall extending through the interlayer insulating film so as to be in contact with the element-isolation insulating film, and formed from the same material as that of the plug portion of the storage node. This also enables the etch stopper member to be provided without increasing the number of steps, thereby preventing increase in manufacturing costs.

The etch stopper member may be formed from a dummy gate line and a cylindrical wall, the dummy gate line being provided on the element-isolation insulating film and formed from the same material as that of the gate electrode, and the cylindrical wall extending through the interlayer insulating film so as to be in contact with the dummy gate line, and formed from the same material as that of the plug portion of the storage node. Thus, the aforementioned effects can be more effectively obtained.

A logic transistor including a gate insulating film, a gate electrode and source/drain regions may be provided on the semiconductor substrate. This enables reduction in the area of the DRAM memory section in a semiconductor device incorporating a DRAM and logic.

A method for manufacturing a semiconductor device according to the invention includes the steps of: (a) forming an element-isolation insulating film surrounding first and second active regions of a semiconductor substrate; (b) depositing a gate insulating film and a polysilicon film on the substrate, and then patterning the polysilicon film so as to form first and second gate electrodes on the first and second active regions, respectively; (c) introducing impurities into regions located on both sides of each of the first and second electrodes in the first and second active regions within the semiconductor substrate so as to form first and second source/drain regions, respectively; (d) forming an interlayer insulating film on the substrate; (e) forming in the first interlayer insulating film a first contact hole extending to each of the first source/drain regions; (f) forming a storage node from both a plug portion filling the first contact hole and an electrode portion extending on the interlayer insulating film; (g) forming a capacity insulating film on the electrode portion of the storage node; (h) forming a cell plate electrode facing the electrode portion of the storage node with the capacity insulating film interposed therebetween; (i) etching the interlayer insulating film using the cell plate electrode as a mask, thereby exposing the second gate electrode; and (j) forming, prior to the step (g), an etch stopper member under the cell plate electrode so as to surround the first active region along a periphery of the cell plate electrode, the etch stopper member being formed from a material that is resistant to an etchant of the interlayer insulating film.

According to this method, the etch stopper member having a high etching selection ratio to the interlayer insulating film is formed under the cell plate electrode in the step (j). Therefore, the first interlayer insulating film located under the cell plate electrode will not be etched in the step (i). Accordingly, a dimensional margin in preparation for partial removal of the interlayer insulating film under the cell plate electrode need not be provided for the cell plate electrode, allowing for reduction in the area of the DRAM memory section.

The step (j) may be conducted by patterning the polysilicon film in the step (b) so as to form on the element-isolation insulating film a dummy gate line extending along a periphery of a region where the cell plate electrode is to be formed. Alternatively, the step (j) may be conducted by: forming on the element-isolation insulating film a cylindrical groove extending through the first interlayer insulating film in the step (e); and filling the cylindrical groove with the same material as that of the plug portion of the storage node in the step (f). Alternatively, the step (j) may be conducted by: patterning the polysilicon film in the step (b) so as to form on the element-isolation insulating film a dummy gate line extending along a periphery of a region where the cell plate electrode is to be formed; forming on the element-isolation insulating film a cylindrical groove extending through the first interlayer insulating film to the dummy gate line in the step (e); and filling the cylindrical groove with the same material as that of the plug portion of the storage node in the step (f). This enables reduction in the area of the DRAM memory section without increasing the number of steps.

BRIEF DESCRIPTION OF THE DRAWINGS

FIGS. 3A and 3B are cross-sectional views illustrating the manufacturing process of the semiconductor device of the first embodiment from the step of forming a second interlayer insulating film to the step of forming a wiring layer;

FIGS. 5A and 5B are cross-sectional views illustrating the manufacturing process of the semiconductor device of the second embodiment from the step of forming a capacitor to the step of removing a first interlayer insulating film and forming a sidewall;

FIGS. 6A and 6B are cross-sectional views illustrating the manufacturing process of the semiconductor device of the second embodiment from the step of forming a second interlayer insulating film to the step of forming a wiring layer;

FIGS. 10A and 10B are cross-sectional views illustrating the conventional manufacturing process of the semiconductor device from the step of forming a capacitor to the step of removing a first interlayer insulating film and forming a sidewall;

DETAILED DESCRIPTION OF THE INVENTION (First Embodiment)

Figure 1A:
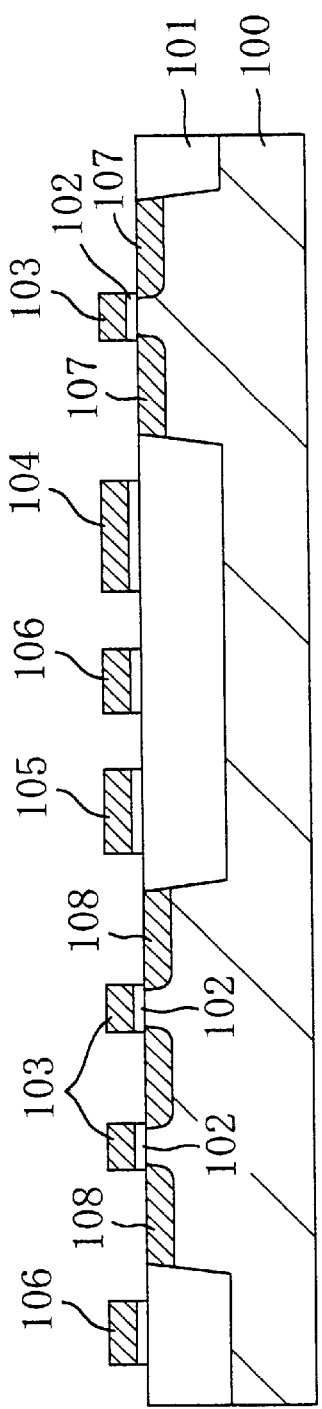
FIGS. 1A to 1C are cross-sectional views illustrating a manufacturing process of a semiconductor device according to a first embodiment from the beginning to the step of forming a storage node electrode.

FIGS. 1A to 3B are cross-sectional views illustrating a manufacturing process of an e-DRAM semiconductor device according to the first embodiment of the invention. More specifically, FIGS. 1A to 1C illustrate from the beginning of the manufacturing process of the semiconductor device to the step of forming a storage node electrode in a DRAM memory section. FIGS. 2A and 2B illustrate from the step of forming a capacitor of the DRAM memory section to the step of removing a first interlayer insulating film and forming a sidewall. FIGS. 3A and 3B illustrate from the step of forming a second interlayer insulating film to the step of forming a wiring layer.

First, in the step of FIG. 1A, an element-isolation insulating film 101 surrounding active regions of a DRAM memory section and a logic section is formed at a silicon substrate 100. Then, a silicon oxide film having a thickness of about 3 nm and a polysilicon film having a thickness of about 100 nm are sequentially formed on the substrate. Thereafter, these films are patterned to form a gate insulating film 102 and a gate electrode 103 of each MIS transistor of the DRAM memory section and the logic section.

Figure 13:
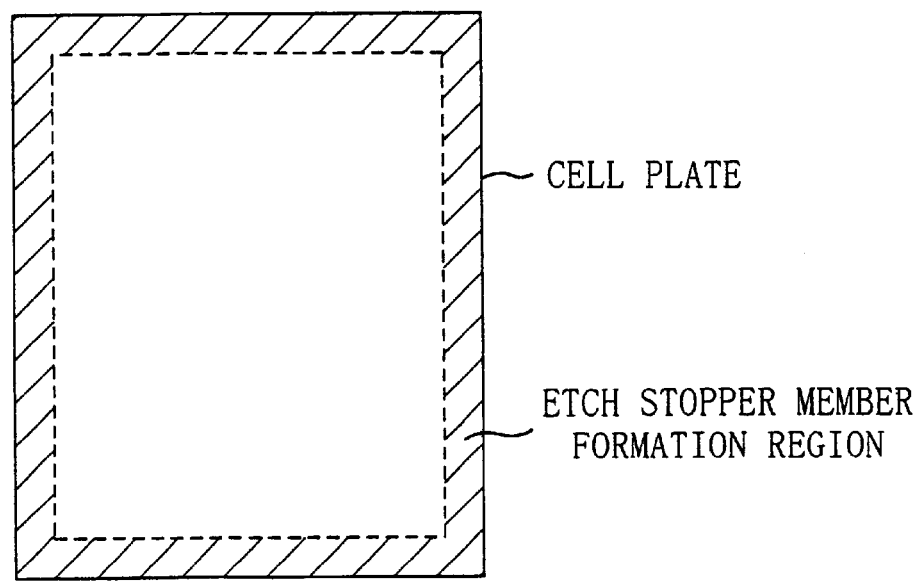
FIG. 13 is a plan view schematically showing the location where an etch stopper member for a cell plate electrode of each embodiment is to be formed.

At this time, a gate line 104 connected to the gate electrode 103 of the logic section and a gate line 105 connected to the gate electrode 103 of the DRAM memory section are formed on the element-isolation insulating film 101. In addition, an annular dummy gate line 106 is also formed on the element-isolation insulating film 101 within the DRAM memory section. More specifically, the annular dummy gate line 106 is formed under a cell plate electrode that is formed later. The dummy gate line 106 surrounds the active region along the periphery of the cell plate electrode. The present embodiment is characterized by this dummy gate electrode 106. FIG. 13 is a plan view schematically showing the location where an etch stopper member (dummy gate line 106 and silicon nitride film 109) for the cell plate electrode is to be formed (the hatched portion of the figure).

Then, arsenic ions are implanted into the active regions of the logic section and the DRAM memory section at an acceleration voltage of 10 keV and dose of $1\times10^{14}$ atoms·cm$^{-2}$, thereby forming LDD regions 107 of the MIS transistor of the logic section as well as source/drain regions 108 of the MIS transistor (memory cell transistor) of the DRAM memory section.

Figure 1B:
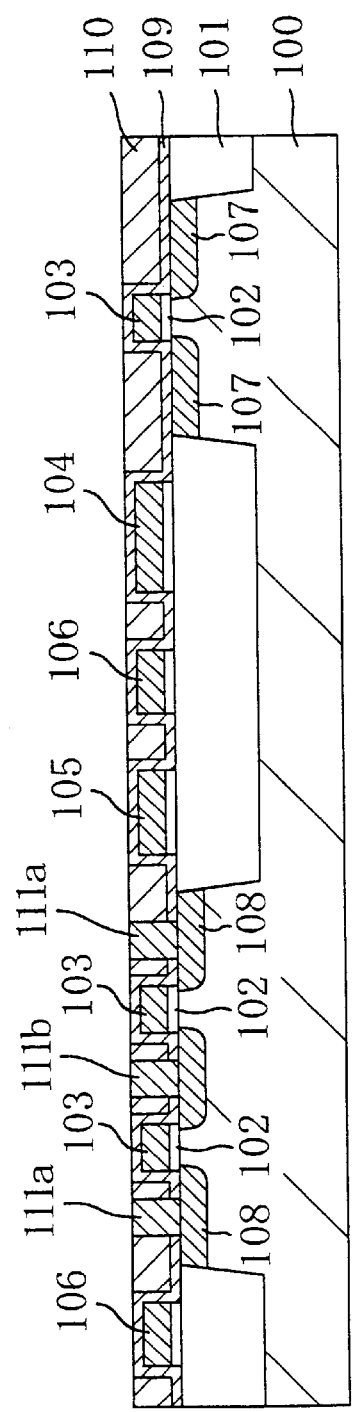

In the step of FIG. 1B, a silicon nitride film 109 having a thickness of about 50 nm is deposited on the substrate so as to cover the gate electrodes 103 and the gate lines 104, 105, 106. Then, a first interlayer insulating film 110 of a silicon oxide film is deposited on the substrate. By using a CMP (Chemical Mechanical Polishing) method, the first interlayer insulating film 110 is polished for planarization until the silicon nitride film 109 is exposed at a location corresponding to the top surface of the dummy gate line 106. Then, contact holes having a diameter of about 0.22 μm are formed in the DRAM memory section so as to extend through the first interlayer insulating film 110 and the silicon nitride film 109 to the respective source/drain regions 108. At this time, no contact hole is formed in the logic section. Then, each contact hole is filled with a conductor film (e.g., a polysilicon film or a tungsten film), thereby forming a conductor plug 111a (part of a storage node) connected to the source of the source/drain regions 108 of the MIS transistor of the DRAM memory section, and a conductor plug 111b (bit-line contact) connected to the drain of the source/drain regions 108. Note that the conductor plug 111b is not necessarily formed in the cross section of FIG. 1B and FIGS. 1C to 3B described below, but is shown as being present in this cross section for better understanding.

Figure 1C:
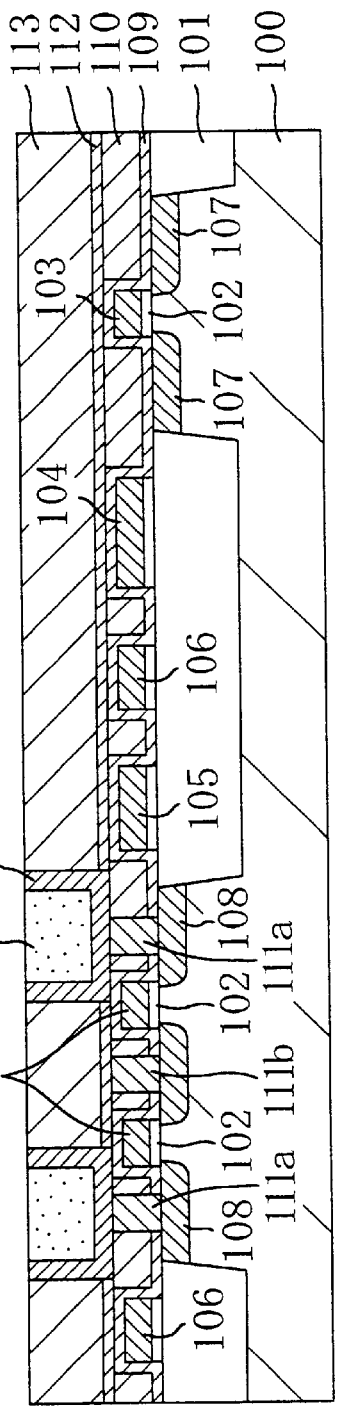

Then, in the step of FIG. 1C, a silicon nitride film 112 having a thickness of about 50 nm is formed on the substrate so as to cover the first interlayer insulating film 110 and the conductor plugs 111a, 111b. Thereafter, a silicon oxide film 113 is deposited on the substrate. The silicon oxide film 113 and the silicon nitride film 112 are selectively removed to form an opening such that the conductor plug 111a on the source of the source/drain regions 108 of the DRAM memory section is exposed at the bottom of the opening. Then, a polysilicon film having a thickness of about 100 nm and a photoresist film are formed on the substrate, and the top surface of the substrate is planarized by using an etch-back method. Thus, a bottomed cylindrical storage node electrode 114 of the polysilicon film as well as a photoresist portion 150 that fills a recess formed by the storage node electrode 114 are formed in the opening.

Figure 2A:
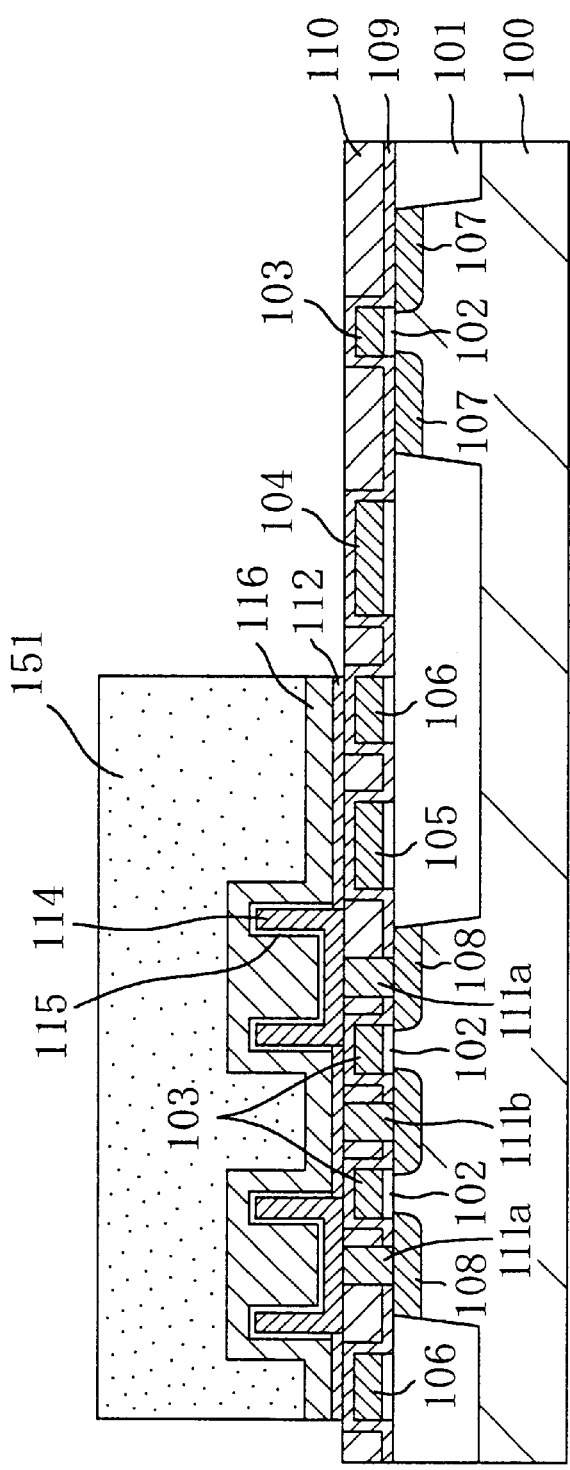
FIGS. 2A and 2B are cross-sectional views illustrating the manufacturing process of the semiconductor device of the first embodiment from the step of forming a capacitor to the step of removing a first interlayer insulating film and forming a sidewall.

In the step of FIG. 2A, the photoresist portion 150 is removed by ashing or the like, and then the silicon oxide film 113 is selectively removed using hydrofluoric acid or the like. Then, a silicon nitride film having a thickness of about 5 nm is deposited on the substrate. Thereafter, by using a dilute pyro-oxidation method, the substrate is thermally processed at 800° C. for thirty minutes so as to form a capacity insulating film 115 on the storage node electrode 114. Then, a polysilicon film having a thickness of about 100 nm is deposited on the substrate, and a photoresist film 151 is formed so as to cover the DRAM memory section as well as expose the logic section. The polysilicon film and the silicon nitride film 112 are removed in the logic section by anisotropic dry etching using the photoresist film 151 as a mask, thereby forming a cell plate electrode 116 on the silicon nitride film 112.

Figure 2B:
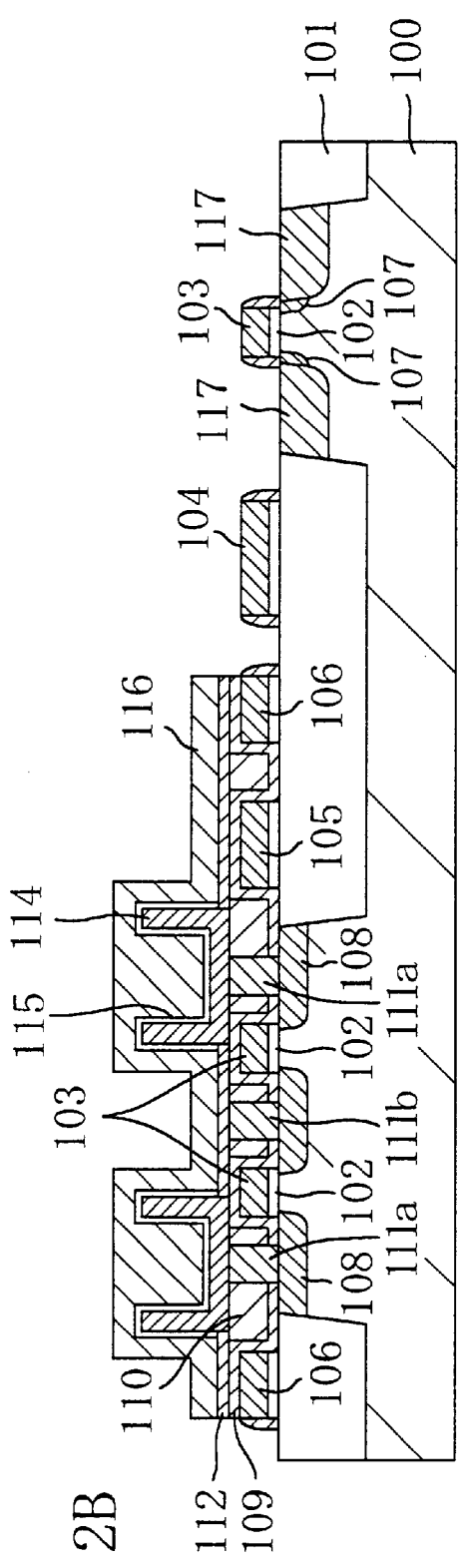

In the step of FIG. 2B, the photoresist film 151 is removed. Then, by using the cell plate electrode 116 as a mask, the first interlayer insulating film 110 of the logic section is selectively removed by wet etching with hydrofluoric acid. In the DRAM memory section, the silicon nitride film 112 serving as an underlying film of the cell plate electrode 116 is in contact with the silicon nitride film 109 on the dummy gate line 106 with no space therebetween. Therefore, the first interlayer insulating film 110 of the DRAM memory section is hardly etched away. More specifically, in the present embodiment, an etch stopper member is formed from the dummy gate line 106 and the silicon nitride film 109. It should be noted that the silicon nitride film 109 may not be formed, and the etch stopper member may be formed only from the dummy gate line 106.

Thereafter, the exposed portion of the silicon nitride film 109 on the substrate is anisotropically etched (dry etched) to form sidewalls on the respective side surfaces of the gate electrode 103 and the gate line 104 of the logic section. Arsenic ions are then implanted into the active regions of the logic section at an acceleration voltage of 20 keV and dose of $2\times10^{15}$ atoms·cm$^{-2}$, thereby forming high-concentration source/drain regions 117 outside the LDD regions 107.

In the step of FIG. 3A, a second interlayer insulating film 118 of a silicon oxide film is deposited on the substrate. Then, contact holes 119 are formed in the DRAM memory section so as to extend through the second interlayer insulating film 118, the cell plate electrode 116 and the silicon nitride film 112 (and also the silicon nitride film 109) to the conductor plug 111b on the drain of the source/drain regions 108 and the gate line 105, respectively. A silicon oxide film having a thickness of about 20 nm is then deposited on the substrate by a CVD (Chemical Vapor Deposition) method, and anisotropically etched to form an oxide-film sidewall 120 on the side surface of each contact hole 119.

In the step of FIG. 3B, contact holes are formed in the logic section so as to extend through the second interlayer insulating film 118 to the high-concentration source/drain regions 117 and the gate line 104, respectively. Then, a conductor plug 121 filling each contact hole 119 of the DRAM memory section as well as a conductor plug 122 filling each contact hole of the logic section are simultaneously formed. A wiring 123 of an aluminum alloy film or the like is formed on the second interlayer insulating film 118 so as to be connected to each conductor plug 121, 122.

Figure 11A:
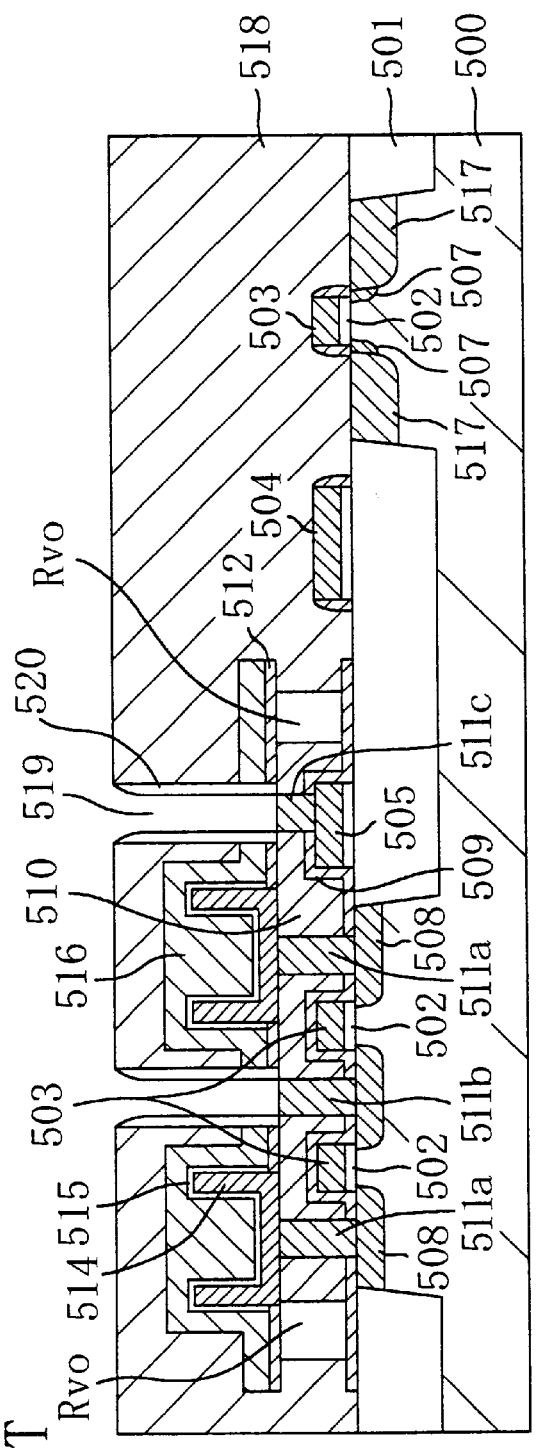
FIGS. 11A and 11B are cross-sectional views illustrating the conventional manufacturing process of the semiconductor device from the step of forming a second interlayer insulating film to the step of forming a wiring layer.
Figure 11B:
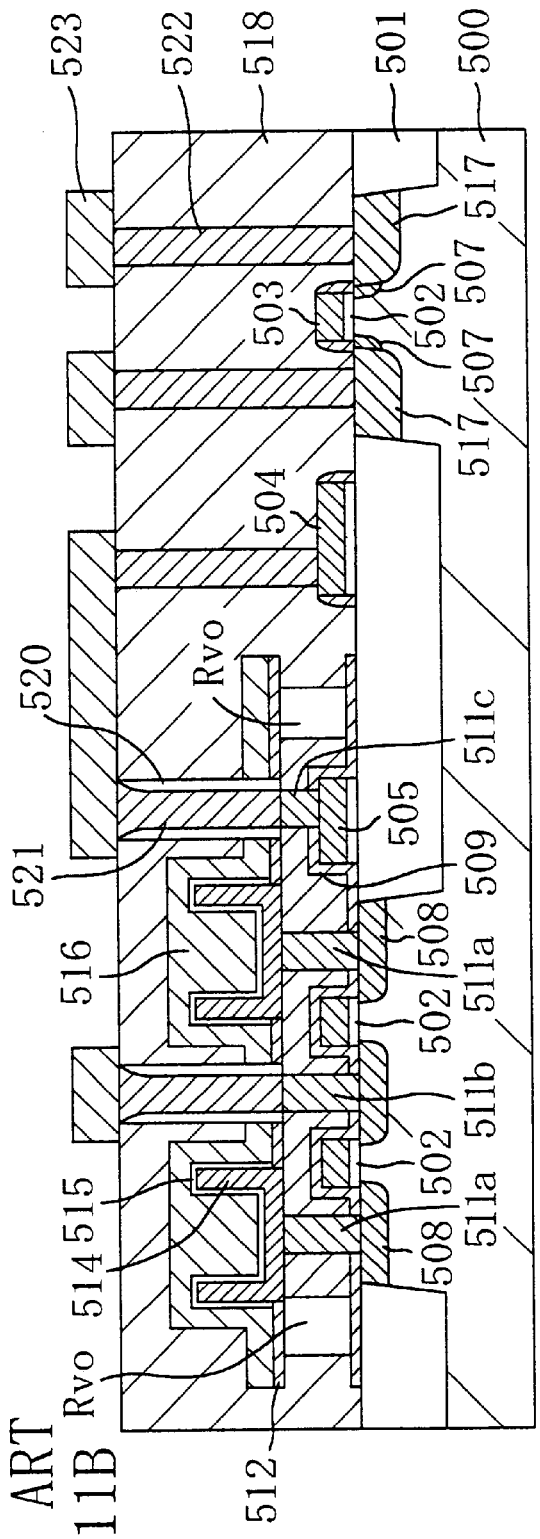

According to the present embodiment, in the step of FIG. 2A, the dummy gate line 106 is formed under the cell plate electrode 116 so as to surround the active region along the periphery of the cell plate electrode 116. Therefore, the interlayer insulating film 110 is hardly removed in the DRAM memory section. Therefore, no void region as in the conventional example (void region Rvo as shown in FIGS. 11A, 11B and the like) is produced upon subsequent formation of the second interlayer insulating film 118. This eliminates the need for a margin for forming the word-line contact in a region other than the void regions, allowing for reduction in the area of the cell plate electrode 116, i.e., the area of the DRAM memory section. Accordingly, an e-DRAM integrating memory cells at a high density and a manufacturing method of the same can be provided.

Comparison of the dimension of the memory cell region between the conventional e-DRAM and the e-DRAM of the present embodiment will be described later with reference to FIGS. 8A to 8C together with the second and third embodiments.

(Second Embodiment)

Figure 4A:
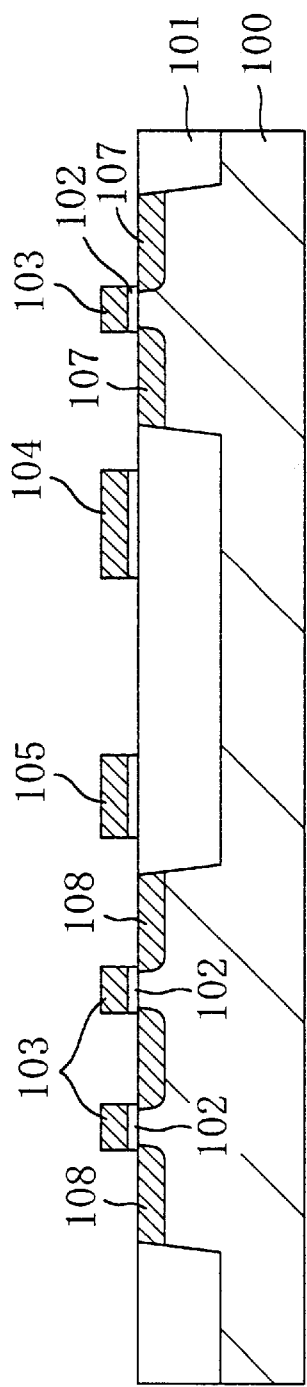
FIGS. 4A to 4C are cross-sectional views illustrating a manufacturing process of a semiconductor device according to a second embodiment from the beginning to the step of forming a storage node electrode.

FIGS. 4A to 6B are cross-sectional views illustrating a manufacturing process of an e-DRAM semiconductor device according to the second embodiment of the invention. More specifically, FIGS. 4A to 4C illustrate from the beginning of the manufacturing process of the semiconductor device to the step of forming a storage node electrode in a DRAM memory section. FIGS. 5A and 5B illustrate from the step of forming a capacitor of the DRAM memory section to the step of removing a first interlayer insulating film and forming a sidewall. FIGS. 6A and 6B illustrate from the step of forming a second interlayer insulating film to the step of forming a wiring layer.

First, in the step of FIG. 4A, an element-isolation insulating film 101 surrounding active regions of a DRAM memory section and a logic section is formed at a silicon substrate 100. Then, a silicon oxide film having a thickness of about 4 nm and a polysilicon film having a thickness of about 100 nm are sequentially formed on the substrate. Thereafter, these films are patterned to form a gate insulating film 102 and a gate electrode 103 of each MIS transistor of the DRAM memory section and the logic section. At this time, a gate line 104 connected to the gate electrode 103 of the logic section and a gate line 105 connected to the gate electrode 103 of the DRAM memory section are formed on the element-isolation insulating film 101. However, no dummy gate line as in the first embodiment is formed in this step.

Then, arsenic ions are implanted into the active regions of the logic section and the DRAM memory section at an acceleration voltage of 10 keV and dose of $1 \times 10^{14}$ atoms·cm$^{-2}$, thereby forming LDD regions 107 of the MIS transistor of the logic section as well as source/drain regions 108 of the MIS transistor (memory cell transistor) of the DRAM memory section.

Figure 4B:
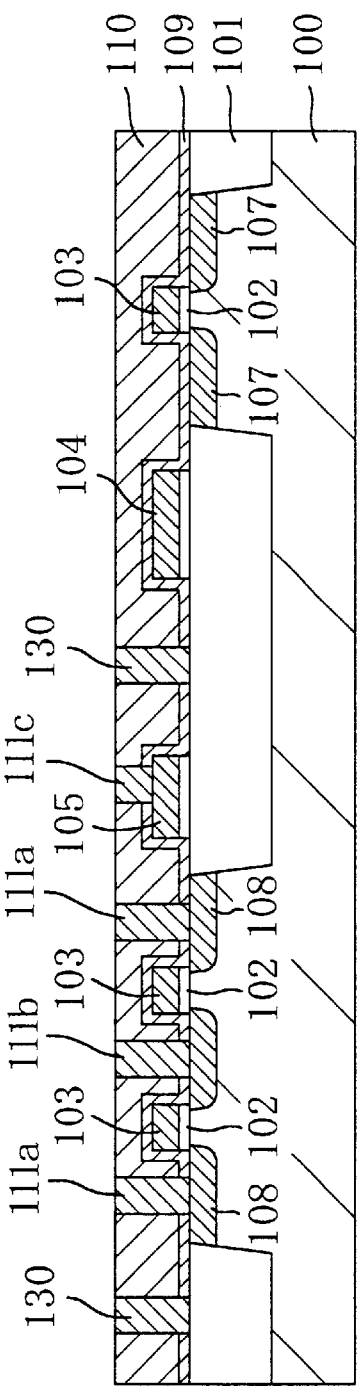

In the step of FIG. 4B, a silicon nitride film 109 having a thickness of about 80 nm is deposited on the substrate so as to cover the gate electrodes 103 and the gate lines 104, 105. Then, a first interlayer insulating film 110 of a silicon oxide film is deposited on the substrate so as to have a thickness of about 0.5 μm. By using a CMP method, the first interlayer insulating film 110 is polished for planarization down to such a level that the first interlayer insulating film 110 is left with a thickness of 50 nm on the silicon nitride film 109 located on the top surface of the gate line 105. Then, contact holes having a diameter of about 0.22 μm are formed in the DRAM memory section so as to extend through the first interlayer insulating film 110 and the silicon nitride film 109 to the source/drain regions 108 and the gate line 105, respectively. No contact hole is formed in the logic section.

Together with the contact holes, an annular groove having a width of about 0.15 μm is simultaneously formed in the DRAM memory section. More specifically, the annular groove is formed under a cell plate electrode that is formed later. The annular groove surrounds the active region along the periphery of the cell plate electrode.

Then, each of the contact holes and the annular groove is filled with a conductor film (e.g., a polysilicon film or a tungsten film), thereby forming a conductor plug 111a (part of a storage node) connected to the source of the source/drain regions 108 of the MIS transistor of the DRAM memory section, a conductor plug 111b (bit-line contact) connected to the drain of the source/drain regions 108, a conductor plug 111c (word-line contact) connected to the gate line 105, and an annular, cylindrical wall 130 located under the cell plate electrode that is formed later in the DRAM memory section (the hatched portion of FIG. 13). This annular, cylindrical wall 130 surrounds the active region along the periphery of the cell plate electrode. The present embodiment is characterized by this cylindrical wall 130. Although the cylindrical wall 130 is in contact with the element-isolation insulating film 101 in the present embodiment, it may alternatively be in contact only with the silicon nitride film 109.

Note that the conductor plug 111b is not necessarily formed in the cross section of FIG. 4B and FIGS. 4C to 6B described below, but is shown as being present in this cross section for better understanding.

Figure 4C:
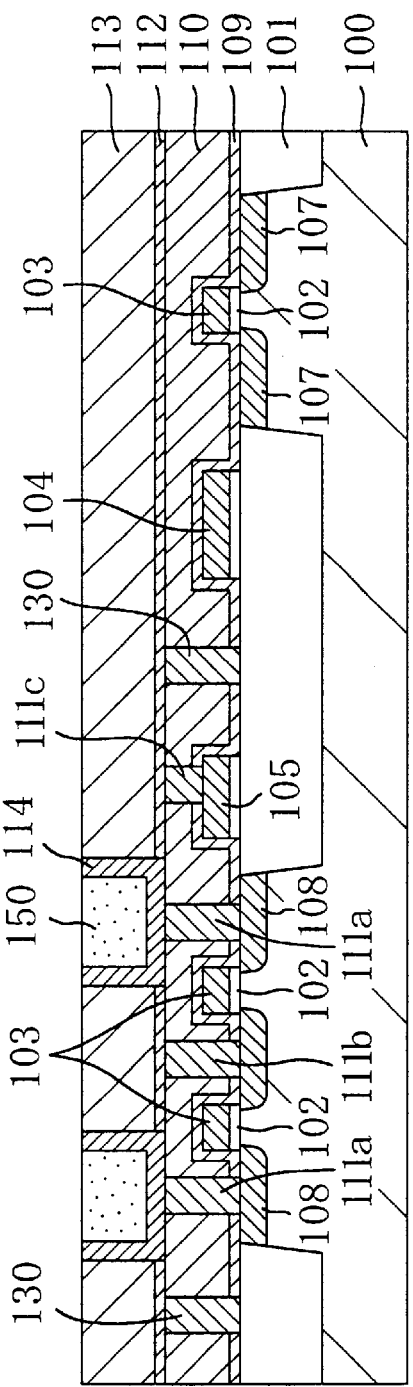

Then, in the step of FIG. 4C, a silicon nitride film 112 having a thickness of about 50 nm is formed on the substrate so as to cover the first interlayer insulating film 110, the conductor plugs 111a, 111b, 111c and the cylindrical wall 130. Thereafter, a silicon oxide film 113 is deposited on the substrate. The silicon oxide film 113 and the silicon nitride film 112 are selectively removed to form an opening such that the conductor plug 111a on the source of the source/drain regions 108 of the DRAM memory section is exposed at the bottom of the opening. Then, a polysilicon film having a thickness of about 100 nm and a photoresist film are formed on the substrate, and the top surface of the substrate is planarized by using an etch-back method. Thus, a bottomed cylindrical storage node electrode 114 of the polysilicon film as well as a photoresist portion 150 that fills a recess formed by the storage node electrode 114 are formed in the opening.

In the step of FIG. 5A, the photoresist portion 150 is removed by ashing or the like, and then the silicon oxide film 113 is selectively removed using hydrofluoric acid or the like. Then, a silicon nitride film having a thickness of about 5 nm is deposited on the substrate. Thereafter, by using a dilute pyro-oxidation method, the substrate is thermally processed at 800° C. for thirty minutes so as to form a capacity insulating film 115 on the storage node electrode 114. Then, a polysilicon film having a thickness of about 100 nm is deposited on the substrate, and a photoresist film 151 is formed so as to cover the DRAM memory section as well as expose the logic section. The polysilicon film and the silicon nitride film 112 are removed in the logic section by anisotropic dry etching using the photoresist film 151 as a mask, thereby forming a cell plate electrode 116 on the silicon nitride film 112.

In the step of FIG. 5B, the photoresist film 151 is removed. Then, by using the cell plate electrode 116 as a mask, the first interlayer insulating film 110 of the logic section is selectively removed by wet etching with hydrofluoric acid. In the DRAM memory section, the silicon nitride film 112 serving as an underlying film of the cell plate electrode 116 is in contact with the cylindrical wall 130 with no space therebetween. Therefore, the first interlayer insulating film 110 of the DRAM memory section is hardly etched away. In other words, in the present embodiment, an etch stopper member is formed from the cylindrical wall 130.

Thereafter, the exposed portion of the silicon nitride film 109 on the substrate is anisotropically etched (dry etched) to form sidewalls on the respective side surfaces of the gate electrode 103 and the gate line 104 of the logic section. Arsenic ions are then implanted into the active regions of the logic section at an acceleration voltage of 20 keV and dose of $2 \times 10^{15}$ atoms·cm$^{-2}$, thereby forming high-concentration source/drain regions 117 outside the LDD regions 107.

In the step of FIG. 6A, a second interlayer insulating film 118 of a silicon oxide film is deposited on the substrate. Then, contact holes 119 are formed in the DRAM memory section so as to extend through the second interlayer insulating film 118, the cell plate electrode 116 and the silicon nitride film 112 to the conductor plug 111b on the drain of the source/drain regions 108 and the conductor plug 111c on the gate line 105, respectively. A silicon oxide film having a thickness of about 20 nm is then deposited on the substrate by a CVD method, and anisotropically etched to form an oxide-film sidewall 120 on the side surface of each contact hole 119.

In the step of FIG. 6B, contact holes are formed in the logic section so as to extend through the second interlayer insulating film 118 to the high-concentration source/drain regions 117 and the gate line 104, respectively. Then, a conductor plug 121 filling each contact hole 119 of the DRAM memory section as well as a conductor plug 122 filling each contact hole of the logic section are simultaneously formed. A wiring 123 of an aluminum alloy film or the like is formed on the second interlayer insulating film 118 so as to be connected to each conductor plug 121, 122.

According to the present embodiment, the cylindrical wall 130 is formed under the cell plate electrode 116 so as to surround the active region along the periphery of the cell plate electrode 116. Therefore, in the step of FIG. 5B, the interlayer insulating film 110 is hardly removed in the DRAM memory section. Therefore, no void region as in the conventional example (void region Rvo as shown in FIGS. 11A, 11B and the like) is produced upon subsequent formation of the second interlayer insulating film 118. This eliminates the need for a margin for forming the word-line contact in a region other than the void regions, allowing for reduction in the area of the cell plate electrode 116, i.e., the area of the DRAM memory section. Accordingly, an e-DRAM integrating memory cells at a high density and a manufacturing method of the same can be provided.

Comparison of the dimension of the memory cell region between the conventional e-DRAM and the e-DRAM of the present embodiment will be described later with reference to FIGS. 8A to 8C together with the first and third embodiments.

(Third Embodiment)

Hereinafter, the third embodiment of the invention will be described. The third embodiment includes both the dummy gate line 106 of the first embodiment and the cylindrical wall 130 of the second embodiment.

Figure 7A:
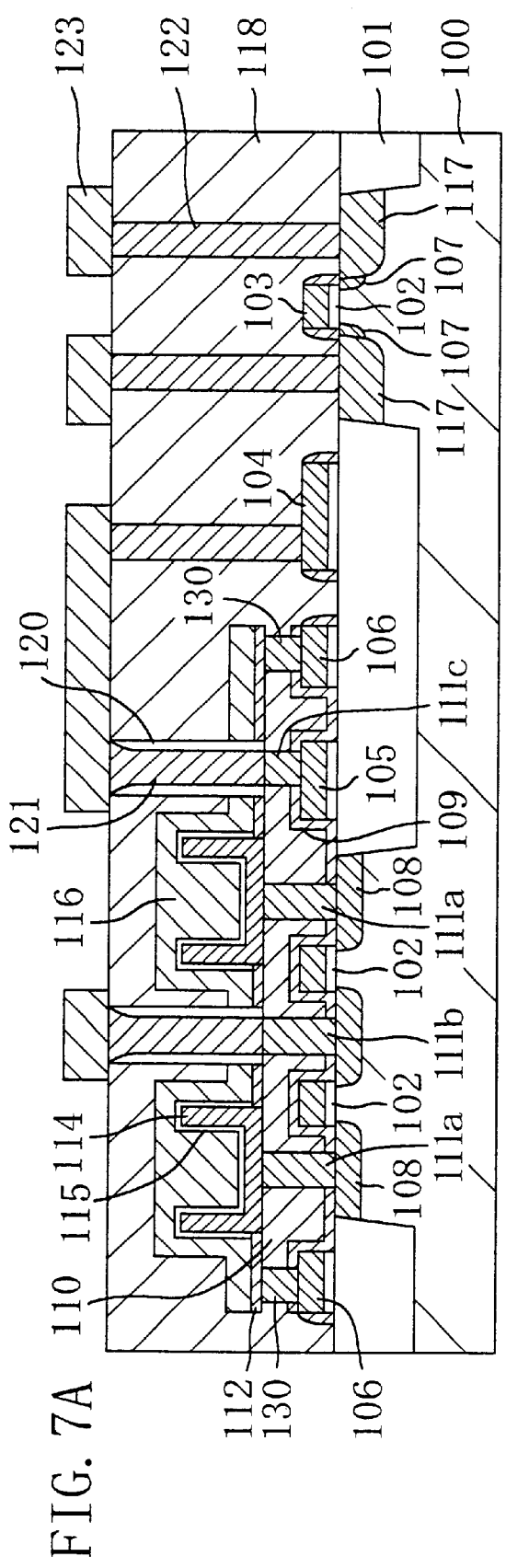
FIGS. 7A and 7B are diagrams showing the structure of a semiconductor device of a third embodiment in different cross sections.
Figure 7B:
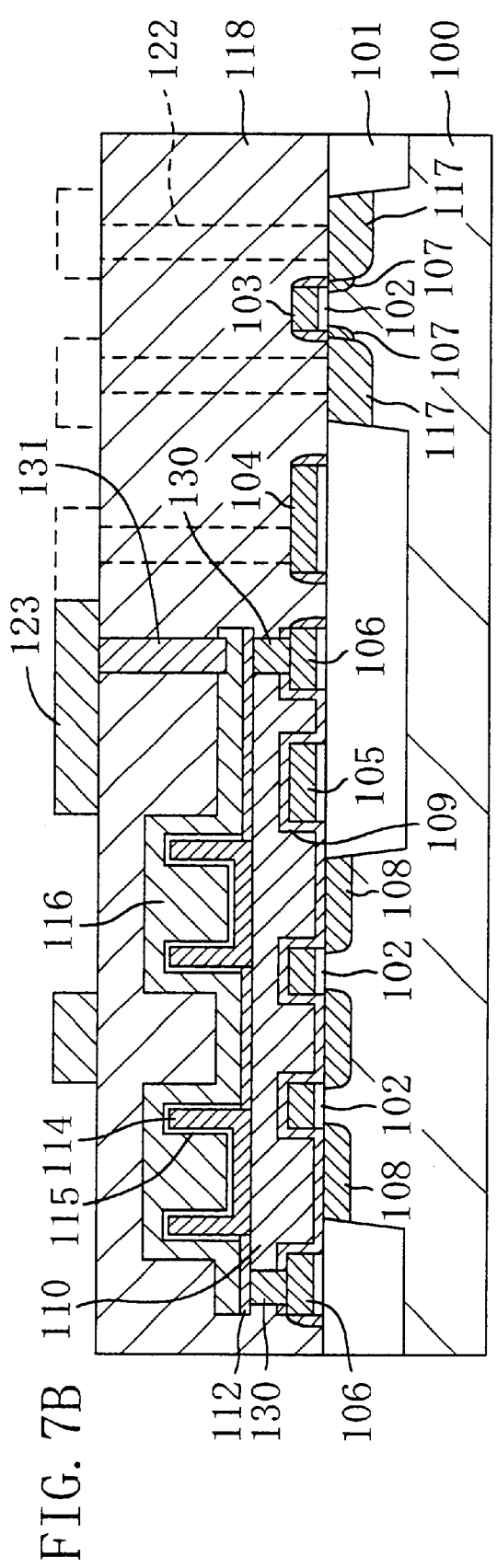

The manufacturing process of the present embodiment is not shown in the figure. FIGS. 7A and 7B are diagrams showing the structure of the semiconductor device of the present embodiment in different cross sections.

As shown in FIG. 7A, in the present embodiment, an annular dummy gate line 106 surrounding the active region along the periphery of the cell plate electrode 116 as well as an annular, cylindrical wall 130 being in contact with the dummy gate line 106 and surrounding the active region along the periphery of the cell plate electrode 116 are formed between the cell plate electrode 116 and the element-isolation insulating film 101 in the DRAM memory section. In other words, in the present embodiment, an etch stopper member is formed from the dummy gate line 106 and the cylindrical wall 130. The other portions of the semiconductor device of the present embodiment are formed by substantially the same steps as those of FIGS. 4A to 6B of the second embodiment.

In the present embodiment, conductor plugs 121 extending through the second interlayer insulating film 118, the cell plate electrode 116 and the silicon nitride film 112 are provided in the DRAM memory section so as to be in contact with the conductor plug 111b on the drain of the source/drain regions 108 and the conductor plug 111c on the gate line 105, respectively. In addition, conductor plugs 122 extending through the second interlayer insulating film 118 are provided in the logic section so as to be in contact with the gate electrode 103 and the high-concentration source/drain regions 117, respectively. A wiring 123 of an aluminum alloy film or the like is formed on the second interlayer insulating film 118 so as to be connected to each conductor plug 121, 122.

According to the present embodiment, the dummy gate line 106 and the cylindrical wall 130 are formed under the cell plate electrode 116 so as to surround the active region along the periphery of the cell plate electrode 116. Therefore, upon wet etching of the first interlayer insulating film 110 in the step of FIG. 2B of the first embodiment or the step of FIG. 5B of the second embodiment, the interlayer insulating film 110 is hardly removed in the DRAM memory section. Therefore, like the first and second embodiments, no void region as in the conventional example (void region Rvo as shown in FIGS. 11A, 11B and the like) is produced upon deposition of the second interlayer insulating film 118. This eliminates the need for a margin for forming the word-line contact in a region other than the void regions, allowing for reduction in the area of the cell plate electrode 116, i.e., the area of the DRAM memory section. Accordingly, an e-DRAM integrating memory cells at a high density and a manufacturing method of the same can be provided. Thus, the same effects as those of the first and second embodiments can be obtained.

The following additional effects can also be obtained in the present embodiment:

As shown in FIG. 7B, in the cross section different from that of FIG. 7A, a conductor plug 131 serving as a contact with the cell plate electrode 116 is formed simultaneously with the other plugs 122. The conductor plug 131 is connected to the wiring 123 for supplying a voltage to the cell plate electrode 116. A contact hole for receiving the conductor plug 131 is not formed simultaneously with the contact hole for receiving the conductor plug 122 of the DRAM memory section, but with the contact hole for receiving the conductor plug 122 of the logic section. Since anisotropic dry etching cannot be conducted at a high etching selection ratio between the polysilicon film and the silicon oxide film, the contact hole may possibly extend to the element isolation insulating film 101. In the present embodiment, however, etching is stopped at the cylindrical wall 130 on the dummy gate line 106. Therefore, the contact hole does not extend to the element-isolation insulating film 101. Note that connecting the dummy gate line 106 with the gate line 104 of the logic section at a location other than this cross section prevents the potential from being rendered in a floating state. Therefore, electrical instability can be avoided.

(Comparison between Each Embodiment and Conventional Example)

Figure 8A:
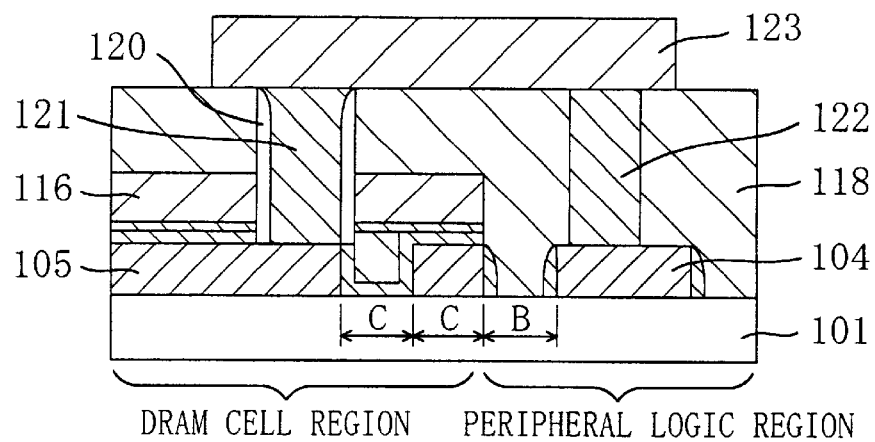
FIGS. 8A to 8C are enlarged cross-sectional views respectively showing a region at the boundary between a DRAM memory section and a logic section of the semiconductor device of the first to third embodiments.
Figure 8B:
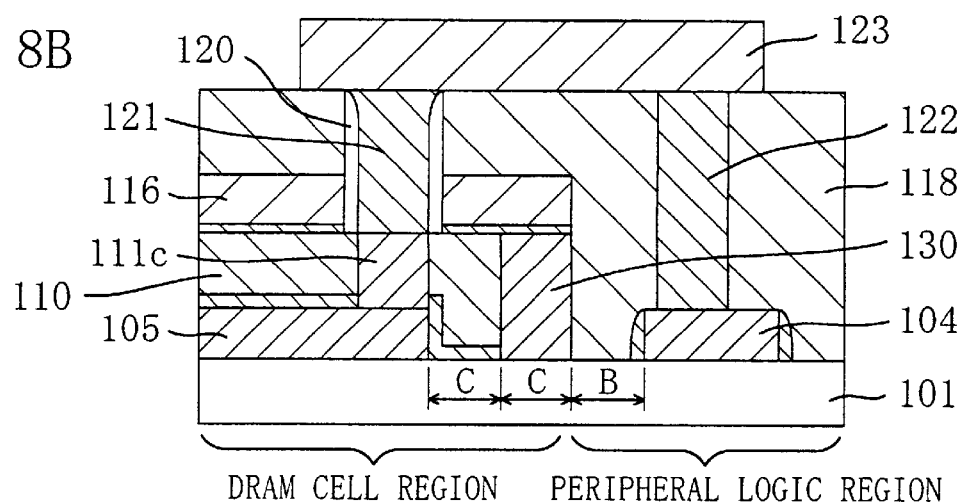
Figure 8C:
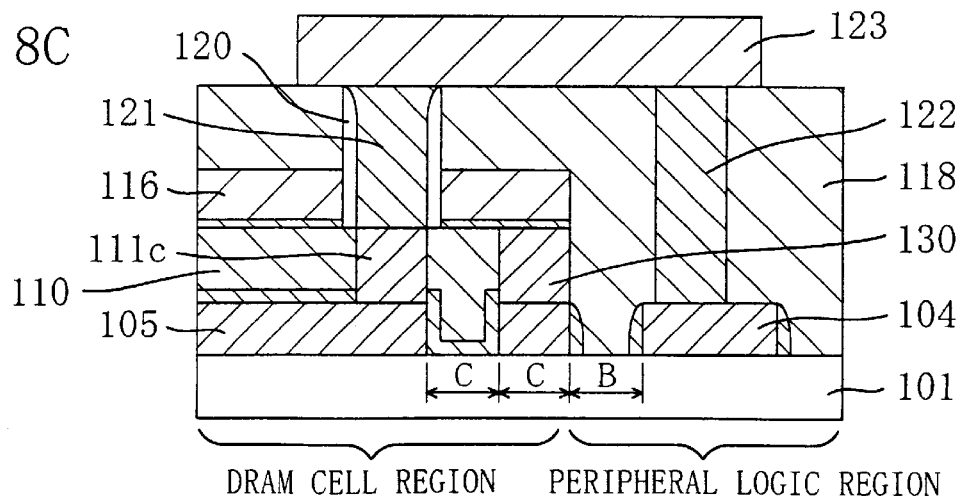
Figure 9A:
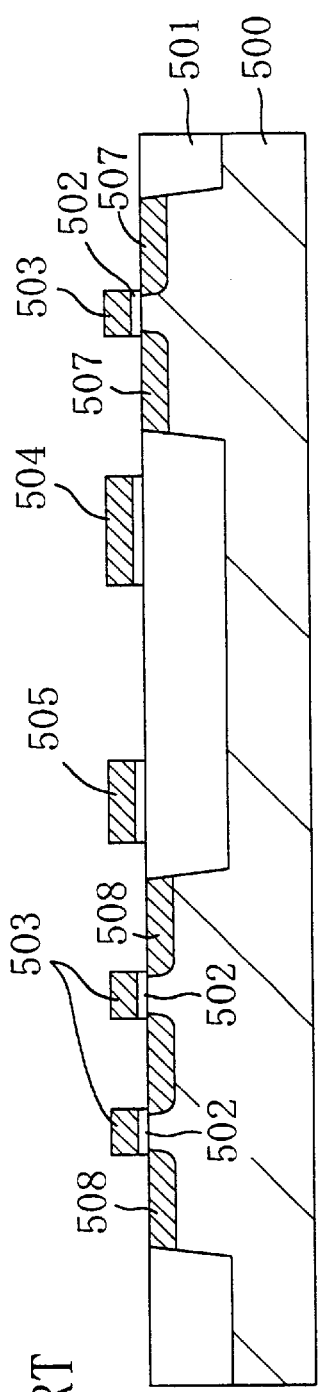
FIGS. 9A to 9C are cross-sectional views illustrating a conventional manufacturing process of a semiconductor device from the beginning to the step of forming a storage node electrode in a DRAM memory section.
Figure 9B:
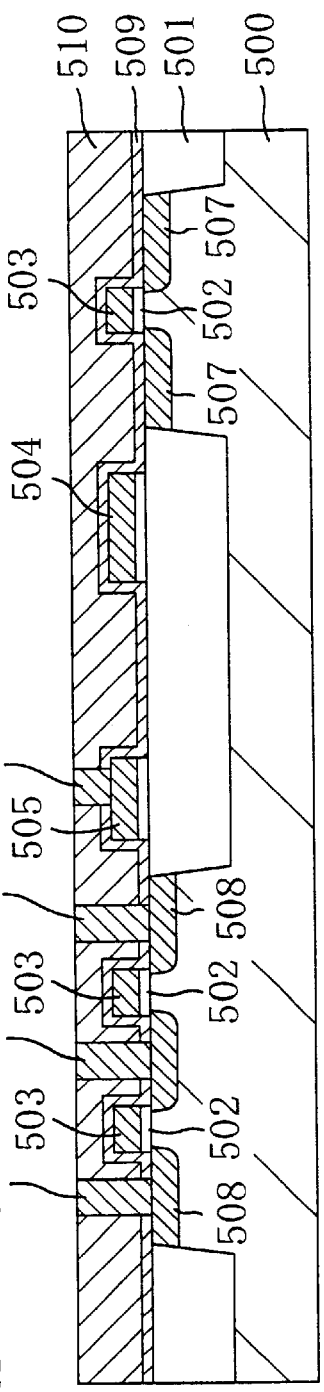
Figure 9C:
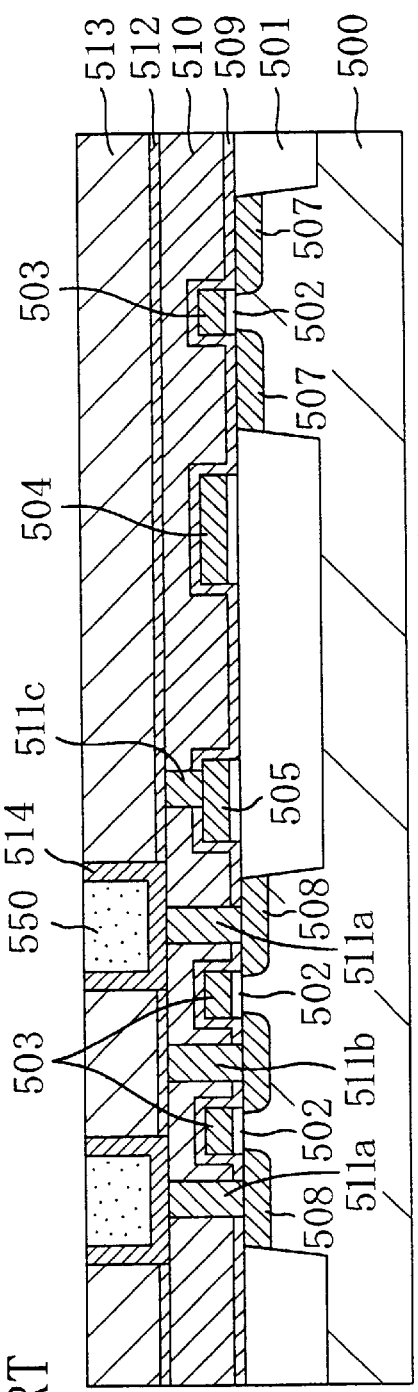

FIGS. 8A to 8C are enlarged cross-sectional views respectively showing a region where the etch stopper member of the e-DRAM of the first to third embodiments is formed, i.e., a region at the boundary between the DRAM memory section and the logic section.

Figure 12:
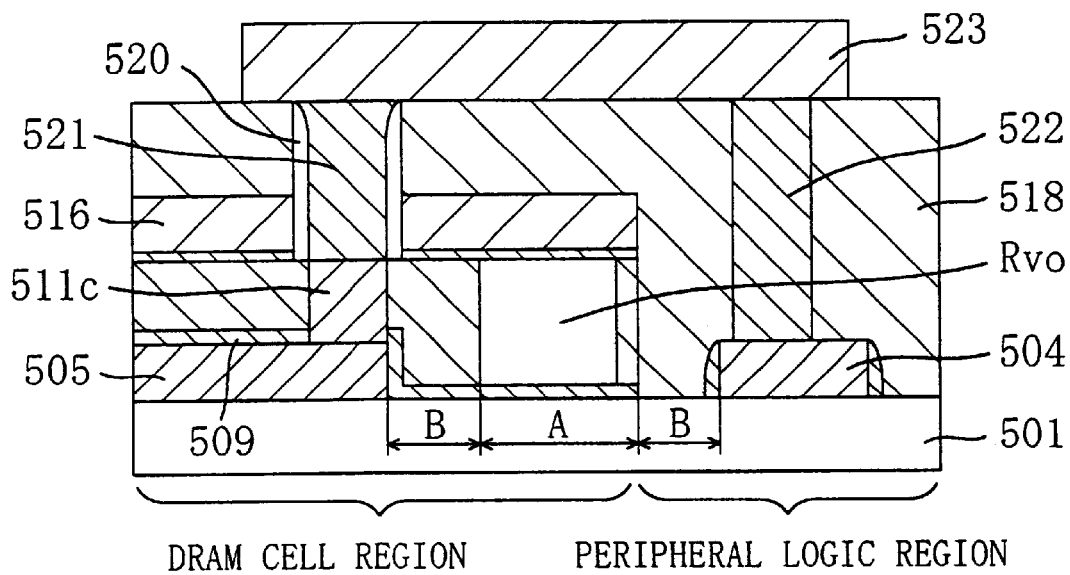
FIG. 12 is a cross-sectional view showing the structure at the boundary between a DRAM memory section and a logic section in a conventional e-DRAM.

As shown in FIG. 12, in the conventional example, there is a void region Rvo under the cell plate electrode 516 at the boundary between the DRAM memory section and the logic section. Therefore, in order to reliably cover the conductor plugs 511c, 521 (word-line contact) of the DRAM memory section with an insulating film, the word-line contact must be provided away from the void region Rvo. In other words, the word-line contact must be separated from the void region Rvo at about the same distance as the distance B between the cell plate electrode 516 and the conductor plug 522 of the logic section (specifically, about 0.3 μm). Since the width A of the void region Rvo is about 1.4 times the thickness of the first interlayer insulating film 518 of FIG. 12. Therefore, provided that the thickness of the interlayer insulating film 510 is 0.5 μm, the width A of the void region Rvo is 0.7 μm. Thus, the conductor plugs 511c and 521 (word-line contact) must be provided at a distance A+B (in this example, about 1.0 μm) from the end of the cell plate electrode 516. In other words, a dimensional margin of 2(A+B) (on both sides) must be provided for the cell plate electrode.

On the other hand, in the first to third embodiments, no void region Rvo is produced under the cell plate electrode 116. Therefore, such a margin of 2(A+B) need not be provided for the cell plate electrode 116. Although the area for the etch stopper member is required, the distance between the dummy gate line 106 and/or the cylindrical wall 130 serving as an etch stopper member and the conductor plugs 121, 111c serving as a word-line contact can be determined based on the minimum rule C. In other words, in the 0.18 μm rule, the distance between the end of the word-line contact and the end of the etch stopper member can be set to twice the minimum rule C (in this example, about 0.36 μm). The distance B between the cell plate electrode and the conductor plug of the logic section is common to the embodiments of the present invention and the conventional semiconductor device.

As can be seen from the above calculation, in the e-DRAM according to each embodiment of the invention, the lateral dimension of the cell plate electrode can be reduced by about 0.64 μm on one side, i.e., about 1.28 μm on both sides, as compared to the conventional e-DRAM. Such reduction in dimension can be applied to the entire outer periphery of the cell plate electrode of each memory cell. Therefore, the area of the DRAM memory section can be significantly reduced in each embodiment of the invention.

Moreover, in each embodiment of the invention, the etch stopper member is formed simultaneously with the gate electrodes, gate lines and conductor plugs of the e-DRAM. Accordingly, the number of steps is not increased as compared to the conventional e-DRAM, causing no increase in costs.

What is claimed is:

1. A semiconductor device, comprising:
    a semiconductor substrate having an active region;
    an element-isolation insulating film provided on the semiconductor substrate so as to surround the active region;
    a gate insulating film and a gate electrode which are provided on the active region of the
    source/drain regions respectively provided in regions located on both sides of the gate electrode within the semiconductor substrate;
    a first interlayer insulating film provided on the semiconductor substrate;
    a storage node having an electrode portion extending on the first interlayer insulating film and a first plug portion extending through the first interlayer insulating film so as to be connected to the source/drain region;
    a capacity insulating film provided on the electrode portion of the storage node;
    a cell plate electrode facing the electrode portion of the storage node with the capacity insulating film interposed therebetween; and
    an annular etch stopper member formed from a material resistant to an etchant of the first interlayer insulating film, and provided under the cell plate electrode so as to surround the active region along a periphery of the cell plate electrode,
    wherein the etch stopper member includes a dummy gate line provided on the element-isolation insulating film and formed from the same material as that of the gate electrode, and
    wherein the interlayer insulating film is not directly deposited on the dummy gate line.

2. The semiconductor device according to claim 1, wherein a logic transistor including a gate insulating film, a gate electrode and source/drain regions is provided on the semiconductor substrate.

3. The semiconductor device according to claim 1 further comprises a silicon nitride film deposited over the semiconductor substrate covering the gate electrode and the dummy gate line,
    wherein the first interlayer insulating film is deposited on the silicon nitride film.

4. The semiconductor device according to claim 1 further comprises a second interlayer insulating film formed on the cell plate electrode,
    a second plug portion extending through the first interlayer insulating film so as to be connected to the source/drain region, and
    a third plug portion extending through the second interlayer insulating film and the cell plate electrode so as to be connected to the second plug portion.

5. The semiconductor device according to claim 1 further comprises a gate line connected to the gate electrode formed on the element-isolation insulating film,
    a second interlayer insulating film formed on the cell plate electrode, and
    a fourth plug portion extending through the second interlayer insulating film and the cell plate electrode so as to be connected to the gate line.

6. The semiconductor device according to claim 5, wherein an oxide-film sidewall is formed on a side surface of a contact hole formed by extending through the second interlayer insulating film and the cell plate electrode.

7. A semiconductor device, comprising:
    a semiconductor substrate having an active region;
    an element-isolation insulating film provided on the semiconductor substrate so as to surround the active region;
    a gate insulating film and a gate electrode which are provided on the active region of the semiconductor substrate;

source/drain regions respectively provided in regions located on both sides of the gate electrode within the semiconductor substrate;

a first interlayer insulating film provided on the semiconductor substrate;

a storage node having an electrode portion extending on the first interlayer insulating film and a first plug portion extending through the first interlayer insulating film so as to be connected to the source/drain region;

a capacity insulating film provided on the electrode portion of the storage node;

a cell plate electrode facing the electrode portion of the storage node with the capacity insulating film interposed therebetween; and an annular etch stopper member formed from a material resistant to an etchant of the first interlayer insulating film, and provided under the cell plate electrode so as to surround the active region along a periphery of the cell plate electrode, wherein the etch stopper member is a cylindrical wall extending through the first interlayer insulating film so as to be in contact with the element-isolation insulating film, and formed from the same material as that of the first plug portion of the storage node.

8. The semiconductor device according to claim 7, wherein a logic transistor including a gate insulating film, a gate electrode and source/drain regions is provided on the semiconductor substrate.

9. The semiconductor device according to claim 7 further comprises a silicon nitride film deposited over the semiconductor substrate covering the gate electrode and the dummy gate line, wherein the first interlayer insulating film is deposited on the silicon nitride film.

10. The semiconductor device according to claim 7, further comprises a second interlayer insulating film formed on the cell plate electrode, a second plug portion extending through the first interlayer insulating film so as to be connected to the source/drain region, and a third plug portion extending through the second interlayer insulating film and the cell plate electrode so as to be connected to the second plug portion.

11. The semiconductor device according to claim 10, wherein an oxide-film sidewall is formed on a side surface of a contact hole formed by extending through the second interlayer insulating film and the cell plate electrode.

12. The semiconductor device according to claim 7 further comprises a gate line connected to the gate electrode formed on the element-isolation insulating film, a second interlayer insulating film formed on the cell late electrode, and a fourth plug portion extending through the second interlayer insulating film and the cell plate electrode so as to be connected to the gate line.

13. The semiconductor device according to claim 12, wherein an oxide-film sidewall is formed on a side surface of a contact hole formed by extending through the second interlayer insulating film and the cell plate electrode.

14. A semiconductor device, comprising:

a semiconductor substrate having an active region;

an element-isolation insulating film provided on the semiconductor substrate so as to surround the active region;

a gate insulating film and a gate electrode which are provided on the active region of the semiconductor substrate;

source/drain regions respectively provided in regions located on both sides of the gate electrode within the semiconductor substrate;

a first interlayer insulating film provided on the semiconductor substrate;

a storage node having an electrode portion extending on the first interlayer insulating film and a first plug portion extending through the first interlayer insulating film so as to be connected to the source/drain region;

a capacity insulating film provided on the electrode portion of the storage node;

a cell plate electrode facing the electrode portion of the storage node with the capacity insulating film interposed therebetween; and an annular etch stopper member formed from a material resistant to an etchant of the first interlayer insulating film, and provided under the cell plate electrode so as to surround the active region along a periphery of the cell plate electrode, wherein the etch stopper member is formed from a dummy gate line and a cylindrical wall, the dummy gate line being provided on the element-isolation insulating film and formed from the same material as that of the gate electrode, and the cylindrical wall extending through the first interlayer insulating film so as to be in contact with the dummy gate line, and formed from the same material as that of the first plug portion of the storage node.

15. The semiconductor device according to claim 14, wherein a logic transistor including a gate insulating film, a gate electrode and source/drain regions is provided on the semiconductor substrate.

16. The semiconductor device according to claim 14, further comprises a silicon nitride film deposited over the semiconductor substrate covering the gate electrode and the dummy gate line, wherein the first interlayer insulating film is deposited on the silicon nitride film.

17. The semiconductor device according to claim 16, wherein an oxide-film sidewall is formed on a side surface of a contact hole formed by extending through the second interlayer insulating film and the cell plate electrode.

18. The semiconductor device according to claim 14 further comprises a second interlayer insulating film formed on the cell plate electrode, a second plug portion extending through the first interlayer insulating film so as to be connected to the source/drain region, and a third plug portion extending through the second interlayer insulating film and the cell plate electrode so as to be connected to the second plug portion.

19. The semiconductor device according to claim 18, wherein an oxide-film sidewall is formed on a side surface of a contact hole formed by extending through the second interlayer insulating film and the cell plate electrode.

20. The semiconductor device according to claim 14 further comprises a gate line connected to the gate electrode formed on the element-isolation insulating film, a second interlayer insulating film formed on the cell plate electrode, and a fourth plug portion extending through the second interlayer insulating film and the cell plate electrode so as to be connected to the gate line.

21. The semiconductor device according to claim 20, wherein an oxide-film sidewall is formed on a side surface of a contact hole formed by extending through the second interlayer insulating film and the cell plate electrode.

* * * * *